(12) United States Patent
Kabbani (10) Patent No.: US 7,626,407 B2
(45) Date of Patent: Dec. 1, 2009

(54) MINIATURE FLUID-COOLED HEAT SINK WITH INTEGRAL HEATER

(75) Inventor: Samer Kabbani, San Marcos, CA (US)

(73) Assignee: Delta Design, Inc., Poway, CA (US)

( * ) Notice: Subject to any disclaimer, the term of this patent is extended or adjusted under 35 U.S.C. 154(b) by 240 days.

(21) Appl. No.: 11/326,340

(22) Filed: Jan. 6, 2006

(65) Prior Publication Data

US 2006/0114013 A1 Jun. 1, 2006

Related U.S. Application Data

(62) Division of application No. 10/785,204, filed on Feb. 23, 2004, now abandoned.

(51) Int. Cl.
*G01R 31/02* (2006.01)
*H05K 7/20* (2006.01)

(52) U.S. Cl. ..................... 324/760; 165/80.4

(58) Field of Classification Search ............... 324/760; 361/699, 701, 702; 165/80.4, 104.33; 257/714; 174/15.1
See application file for complete search history.

(56) References Cited

U.S. PATENT DOCUMENTS

| 5,001,423 | A | | 3/1991 | Abrami et al. | |
|---|---|---|---|---|---|
| 5,034,688 | A | * | 7/1991 | Moulene et al. | 324/760 |
| 5,099,910 | A | | 3/1992 | Walpole et al. | |
| 5,325,052 | A | * | 6/1994 | Yamashita | 324/754 |
| 5,821,505 | A | | 10/1998 | Tustaniwskyj et al. | |
| 5,977,785 | A | * | 11/1999 | Burward-Hoy | 324/760 |
| 6,084,215 | A | | 7/2000 | Furuya et al. | |
| 6,129,973 | A | | 10/2000 | Martin et al. | |
| 6,636,062 | B2 | * | 10/2003 | Gaasch et al. | 324/760 |
| 6,668,570 | B2 | * | 12/2003 | Wall et al. | 62/223 |
| 6,771,086 | B2 | * | 8/2004 | Lutz et al. | 324/760 |
| 6,827,128 | B2 | | 12/2004 | Philpott et al. | |
| 2002/0014894 | A1 | * | 2/2002 | Yonezawa et al. | 324/760 |

OTHER PUBLICATIONS

Dr. Karl Exel, Dr. Juergen Schulz-Harder; "Water Cooled DBC Direct Bonded Copper Substrate;" 5 pgs; undated. Downloaded from the internet at www.curamik.com on Nov. 24, 2003.

* cited by examiner

*Primary Examiner*—Ernest F Karlsen
(74) *Attorney, Agent, or Firm*—Foley & Lardner LLP (57) ABSTRACT

A temperature control device that includes a miniature liquid-cooled heat sink with integral heater and sensing elements is used as part of a system to provide a controlled temperature surface to an electronic device, such as a semiconductor device, during the testing phase. The temperature control device includes an interface surface configured to provide a thermal path from the device to a device under test. One such device has a liquid-cooled heat sink comprising a first heat transfer portion in a first plane and a second heat transfer portion in a second plane. The first and second heat transfer portions establish a three-dimensional cross-flow of coolant within the heat sink structure. An alternate embodiment includes parallel fluid conduits, each having a three-dimensional microchannel structure that directs coolant flow in three dimensions within the fluid conduits. Coolant flows in opposite directions through adjacent fluid conduits, thus resulting in a three-dimensional cross-flow within the heat sink structure.

15 Claims, 8 Drawing Sheets

FIG. 11

MINIATURE FLUID-COOLED HEAT SINK WITH INTEGRAL HEATER

This application is a division of Ser. No. 10/785,204, filed Feb. 23, 2004, now abandoned.

FIELD OF THE INVENTION

The present invention relates generally to a temperature control device that controls the temperature of an electronic device during testing. More particularly, the present invention relates to a miniature liquid-cooled heat sink with integral heater and sensing elements for maintaining constant operating temperature of the electronic device under test.

BACKGROUND OF THE INVENTION

Electronic devices, such as integrated circuit chips, are usually tested prior to use. Device manufacturers typically perform a number of electrical and physical tests to ensure that the devices are free from defects and that the devices function according to their specifications. Common types of device testing include burn-in testing and electrical performance testing.

The operating temperature of an electronic device under test ("DUT") is an important test parameter that usually requires careful monitoring and/or regulating. For example, an electrical test procedure may designate a number of specific test temperatures or a specific range of test temperatures. Consequently, the prior art is replete with different types of temperature control systems, heat sink components, and heater elements designed to heat, cool, and otherwise control the operating temperature of a DUT. These temperature control systems are designed to maintain a steady state DUT operating temperature during the electronic testing procedure. However, it can be difficult to regulate the temperature of a DUT if the DUT exhibits rapid or excessive internal temperature changes while being tested; the electronic devices within the DUT often generate heat which causes such internal temperature changes. The prior art configurations may not be capable of efficiently and effectively compensating for rapid temperature fluctuations generated by the DUT.

BRIEF SUMMARY OF THE INVENTION

A preferred embodiment of the present invention is realized as a temperature control device that includes a miniature fluid-cooled heat sink with integral heater and sensing elements. The device may be used as part of a temperature control system to provide a controlled temperature surface to an electronic DUT, such as a semiconductor device, during the testing phase. In accordance with one example embodiment, the liquid-cooled heat sink includes two internal cooling passages with inlets, outlets and heat transfer portions. The heat transfer portions are located on separate planes and may include cooling fins. There are two integral heaters positioned in the device. Different embodiments are shown for the integral heater locations. In accordance with another example embodiment, a temperature control device includes a fluid-cooled heat sink structure configured to maintain a cross-flow of coolant in three-dimensions for the cooling of a DUT interface surface. The heat sink structure may employ a three-dimensional microchannel structure that directs coolant flow in three dimensions within a respective fluid conduit.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

A temperature control device configured in accordance with the invention employs a fluid-cooled heat sink structure that maintains a cross-flow of coolant in three dimensions for cooling a DUT interface surface of the temperature control device. In one example embodiment, the heat sink structure includes at least two layered heat transfer portions that establish the three-dimensional coolant flow. In another example embodiment, the heat sink structure includes a microchannel structure that forces the coolant to flow in three dimensions within a fluid conduit or channel. Other practical embodiments may also fall within the scope and spirit of the invention.

A miniature fluid-cooled heat sink with integral heater and sensing elements is used as part of a temperature control system to provide a controlled temperature surface to an electronic device, such as a semiconductor device, during the testing phase. The semiconductor device is placed either directly in contact with the device or with an interface material or area-adapting heat spreader, such as a metal plate, while in use. In use, the integral heating element is used to heat itself and the device to a set temperature, the sensing elements detect the temperature, and the coolant flowing through the heat sink removes excess heat from the device.

A practical temperature control device can be designed to accommodate test temperatures between −55 and 155 degrees Celsius. However, most electronic devices are typically tested at temperatures between −45 and 120 degrees Celsius (these example temperature ranges may change in the future and the invention disclosed is not limited to any specific range of test temperatures). In addition, electronic device test specifications do not usually call for temperature transients, i.e., most electronic testing is performed at a substantially steady state operating temperature. One advantage of the devices described herein is that their compact size, low thermal mass, and electronic heating allow very rapid corrections to deviations from the setpoint temperature. Furthermore, the integral nature of the temperature control devices simplifies the design and requires no subsequent assembly. Once assembled, the monolithic nature of the devices, which use thermally conductive materials, ensures that the fluid channel will effectively and repeatably remove heat.

Figure 1:
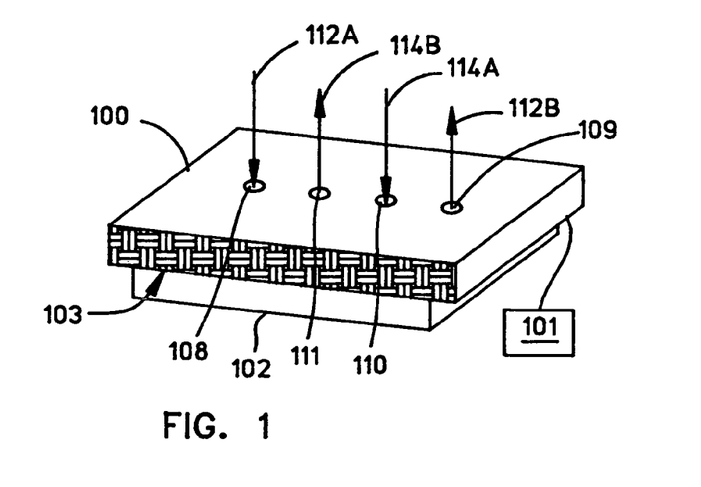
FIG. 1 is an isometric view of a temperature control device for regulating the temperature of a device under test.

FIG. 1 is a perspective view of one embodiment of a temperature control device 100 used for regulating the temperature of a DUT 102. For purposes of the example embodiment described herein, DUT 102 is an electronic semiconductor circuit device, such as a microprocessor chip. Alternatively, DUT 102 may be any electronic, mechanical, or other device being subjected to one or more tests performed under specific temperature settings. The temperature control device 100 may cooperate with a suitable testing system (not shown) that provides a power supply, coolant flow control, input signals, and possibly other inputs to DUT 102. A typical testing system also monitors a number of outputs and signals generated by DUT 102 during the test procedure.

The temperature control device 100 is designed to provide a controlled temperature at an interface surface or first side 103 that provides a thermal path from the temperature control device 100 to the DUT 102. The DUT 102 is preferably held against or in close proximity to interface surface 103 of the temperature control device 100. Inside the temperature control device 100 are internal cooling passages, integral heaters, and sensing elements. To regulate the temperature at the interface surface 103, the integral heaters are turned on to provide heat and a fluid is directed through the cooling passages to provide cooling. The subsequent figures and text will describe the cooling passages and integral heater layers and their locations.

The temperature control device 100 may be regulated by a suitably configured control system 101. The sensing elements are used to provide input to the control system to monitor the temperature of the temperature control device 100 and determine when it should be heated or cooled. The control system 101 generates a control signal that serves as an input signal to the integral heater and/or cooling system contained in temperature control device 100. The control signal may be generated by control system 101 in response to one or more testing criteria, operating conditions, or feedback signals. For example, control system 101 may generate a control signal in response to any of the following parameters: a test temperature setting associated with the current testing specification for DUT 102; an input signal utilized by DUT 102, e.g., an input power signal, an input voltage, or an input current; a signal indicative of the real-time operating temperature of DUT 102; a signal indicative of the real-time operating temperature of an internal component of DUT 102, e.g., a semiconductor die; a signal indicative of the real-time temperature of a portion of temperature control device 100; the RF signature of DUT 102; or the like.

Figure 2:
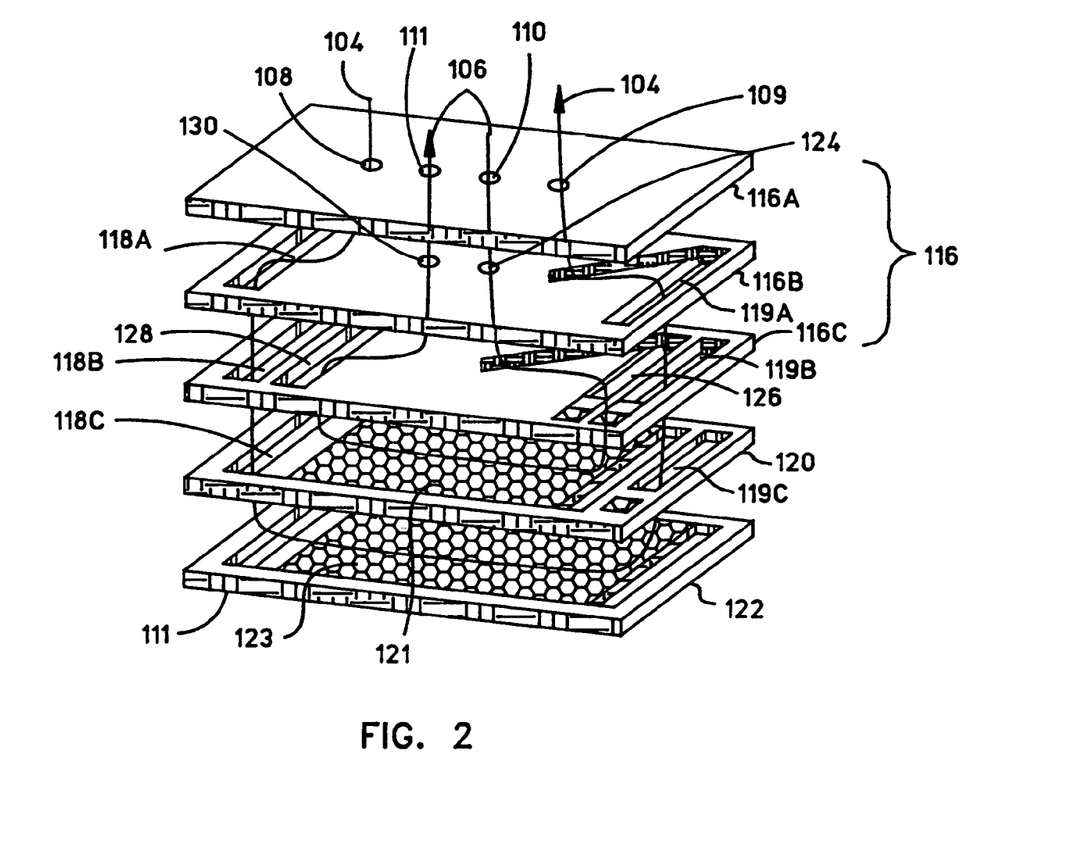
FIG. 2 is an exploded perspective view of the temperature control device of FIG. 1, showing the cooling layers and passages.

To cool the temperature control device 100, a fluid is passed through a first internal cooling passage 104 and a second internal cooling passage 106 (see FIG. 2). The fluid may be water, air, a refrigerant, or any fluid substance having the desired thermal properties. The first internal cooling passage 104 has an inlet 108 and an outlet 109. The second internal cooling passage 106 has an inlet 110 and an outlet 111. As shown in FIG. 1, a first fluid 112A enters through the first inlet 108 and the fluid 112B exits through the first outlet 109. The second fluid 114A enters through the second inlet 110 and the second fluid 114B exits through the second outlet 111. The fluid travels through the internal passages 104 and 106, cooling the temperature control device 100. A coolant system (not shown) may provide the fluid 112 and 114 and cooperate with temperature control device 100 to regulate the temperature and flow rate of the fluid. The coolant system pumps the fluid into temperature control device 100 through the inlets 108 and 110, and receives the return fluid from the outlets 109 and 111. The inlet and outlet ports may be designed with internal threads such that suitable fluid fittings (not shown) can be attached. The fluid fittings receive fluid delivery hoses or conduits that carry the fluid between the temperature control device 100 and coolant system.

FIG. 2 is an exploded view showing some of the layers of the cooling portion of the temperature control device 100. The cooling portion includes two cooling passages 104 and 106 that go through the temperature control device 100. Each cooling passage has an inlet, an outlet, and a heat transfer portion or layer that create a continuous fluid conduit through the device. The inlets and outlets are positioned in the cover layer 116, which may include one or more layers depending on the design. The cover layer 116 shown in FIG. 2 has multiple layers 116A, 116B and 116C that provide channels and passages to direct the fluid flow to the other layers and keep each of the fluid passages separate. The flow of the fluid paths through the cooling passages 104 and 106 are shown in FIG. 2.

The first cooling passage 104 starts at the first inlet 108, in cover layer 116A, opening to a passage on layer 116B that leads to a fluid opening 118A at a first end of the layer 116B. There may be subsequent fluid openings 118, depending on the number of layers and the position of the first heat transfer portion or layer. In the figure shown, there is a fluid opening 118B in layer 116C and a fluid opening 118C in layer 120 that leads to a first heat transfer portion or layer 122. The first heat transfer portion or layer 122 is designed such that fluid enters near a first end, travels across the layer, through various openings or passages, to a second end, where it exits the layer 122. To assist the fluid in spreading out in the heat transfer layer 122, there may be a plurality of fluid channels or fins 123 that lead from the first end to the second end. The particular design of the fluid channels or fins 123 may depend on any number of parameters, such as the thermal properties of the material, the thermal and physical properties of the fluid, the flow rate of the fluid, the size device, and the like. At the second end of the heat transfer layer 122, the fluid passage continues to a fluid opening 119C in layer 120, a fluid opening 119B in layer 116C, to a fluid opening 119A in layer 116B, which finally leads to the first outlet 109.

The second cooling passage 106 starts at the second inlet 110 in cover layer 116A, opening to a passage 124 through a layer 116B that leads to a passage in layer 116C that leads to a fluid opening 126, near fluid opening 199B in layer 116C. There may be subsequent fluid openings 126, depending on the number of layers and the position of the first heat transfer portion or layer. In the figure shown, the fluid opening 126 leads to a second heat transfer portion or layer 120. The second heat transfer portion or layer 120 is designed such that fluid enters near a first end, travels across the layer, through various openings or passages to a second end, where it exits the layer 120. To assist the fluid in spreading out in the heat transfer layer 120, there may be a plurality of fluid channels or fins 121 that lead from the first end to the second. The particular design of the fluid channels or fins 121 may depend on any number of parameters such as the thermal properties of the material, the thermal and physical properties of the fluid, the flow rate of the fluid, the size device, and the like. At the second end of the heat transfer layer 120, the fluid passage 106 leads a to fluid opening 128 in layer 116C, to a fluid opening 130 in layer 116B, which leads to the second outlet 111. The fluid can flow in either direction in the cooling passages, but for enhanced performance, the fluid should flow in opposite directions in each passage. One goal of this design is to reduce the surface temperature gradient of the temperature control device 100.

In the example embodiment, the first heat transfer portion 122 resides in a first plane and the second heat transfer portion 120 resides in a second plane, where the first plane is closer to the interface surface 103 than the second plane. In practice, the two planes are parallel to each other, as depicted in FIG. 2. This stacked arrangement facilitates a cross-flow of coolant in three dimensions. Although two heat transfer layers are shown in the figures, a practical implementation may employ any number of heat transfer layers, whether directly stacked upon each other or separated by one or more other elements.

Figure 3:
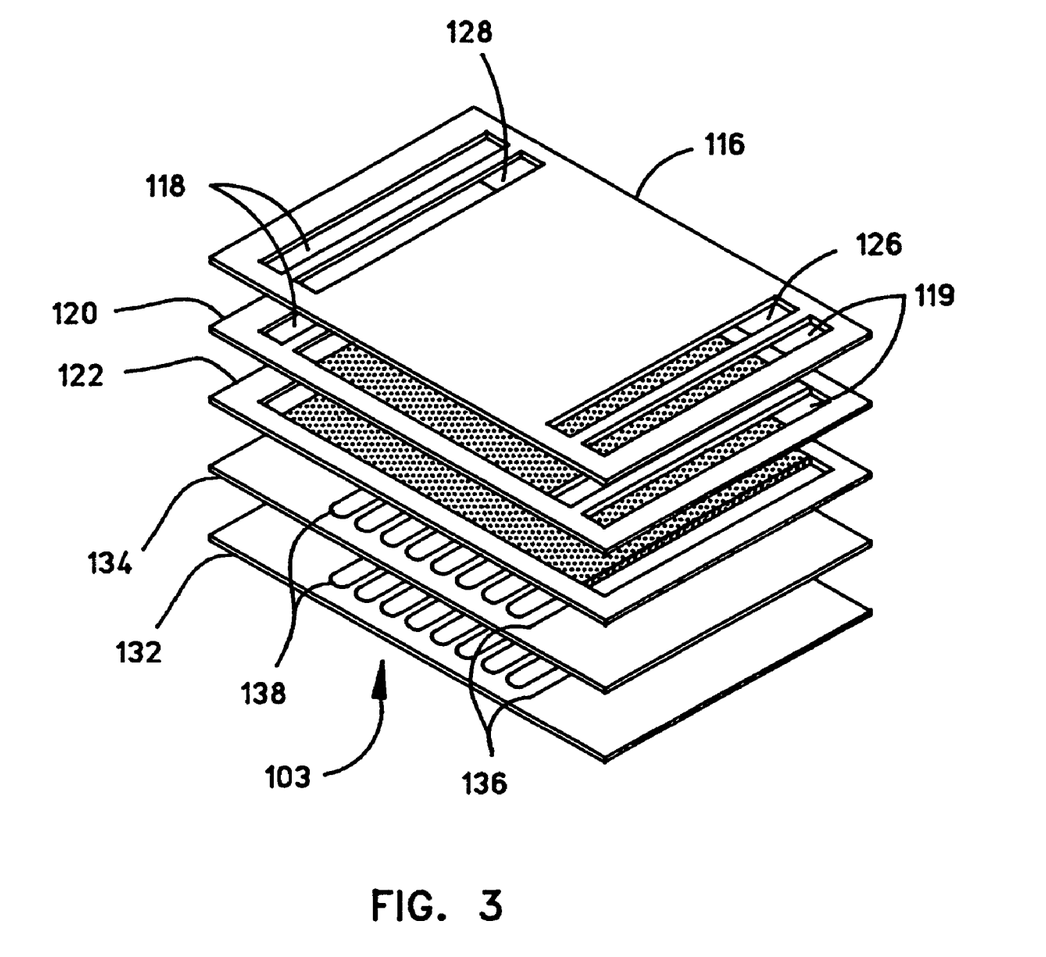
FIGS. 3-5 are exploded perspective views of various temperature control devices, showing the heater layer positions in relation to the cooling layers.
Figure 4:
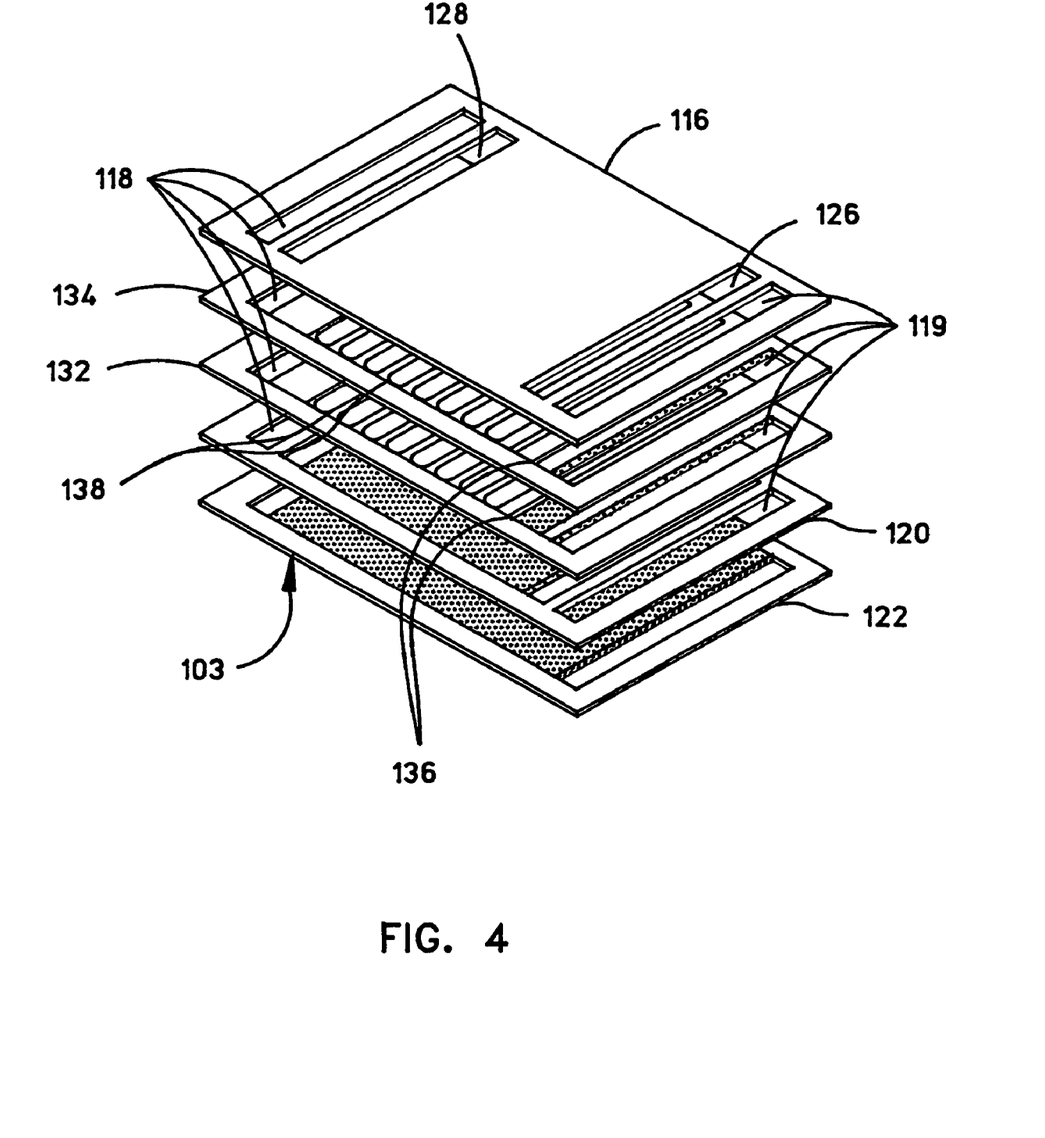
Figure 5:
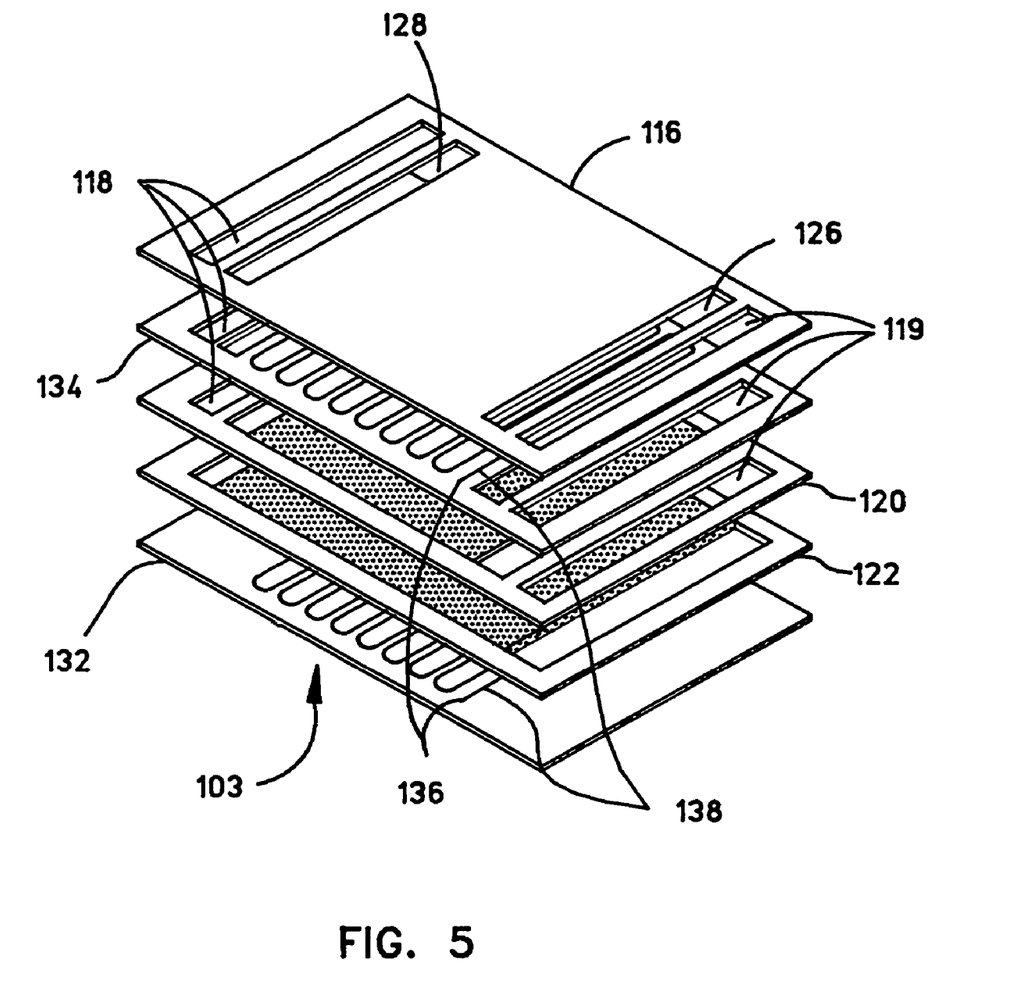
Figure 6:
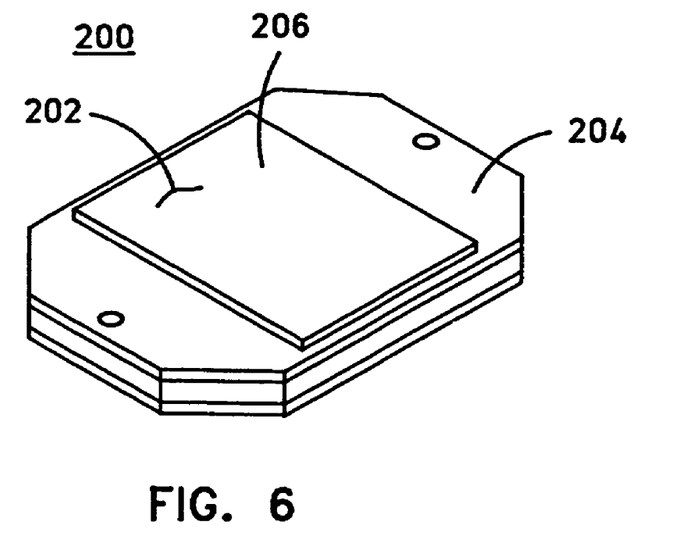
FIG. 6 is a perspective view of a temperature control device, showing the DUT interface surface side.
Figure 7:
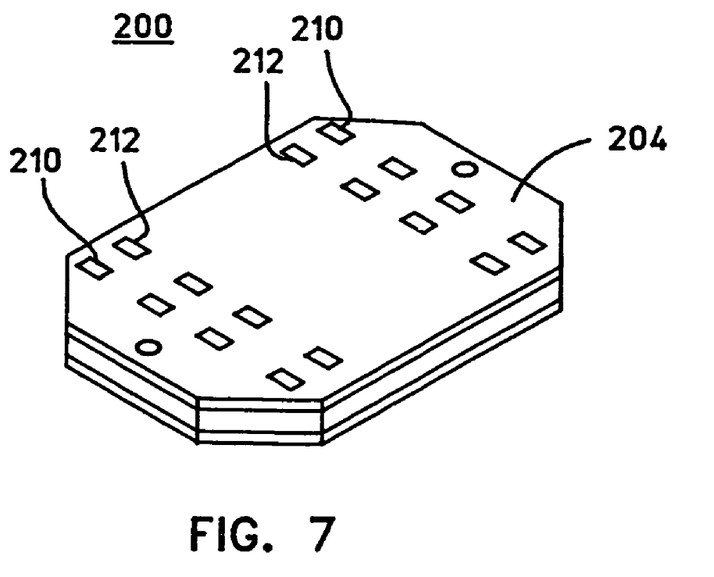
FIG. 7 is a perspective view of the temperature control device shown in FIG. 6, showing the fluid entry/exit side.

There are two integral heaters used in the temperature control device 100 shown, a first heater layer 132 and a second heater layer 134. In practice, any number of heater layers can be utilized. FIGS. 3-5 show examples of some positions where the integral heater layers may be located within the temperature control device 100. In these figures, the cover layer 116 is shown as a single layer, but may have multiple layers, as described above. The heater layers 132 and 134 may be made of electrically resistive serpentine traces 138 on a substrate having external connections 136 connected to a controller 101. The substrate may be made from silicon, ceramic or other appropriate material. The resistive traces 138 may provide uniform heating or may be arranged to provide differential heating with differential control. Where appropriate, there may be fluid openings for fluid passages 104 and 106 in the heater layers. In FIG. 3, the heater layers 132 and 134 are shown proximate the interface surface 103, such that the heat transfer layers 120 and 122 are positioned between the heater layers 132 and 134 and the cover layer 116. Since the heater layers 132 and 134 are positioned away from the cover layer 116 and heat transfer layers 120 and 122, there are no fluid openings required through the heater layers. In FIG. 4, the heat transfer layers 120 and 122 are proximate the interface surface 103 and the heater layers 132 and 134 are positioned between the heat transfer layers 120 and 122 and the cover layer 116. Since the heater layers 132 and 134 are positioned between the cover layer 116 and the heat transfer layers 120 and 122, there are fluid openings 118 and 128 through the heater layers 132 and 134 near a first end, and fluid openings 119 and 126 through them near a second end as part of the fluid passages 104 and 106. The electrically resistive serpentine traces 138 are positioned on each heater layer 132 and 134 between the fluid openings. In FIG. 5, the heater layer 132 is proximate the interface surface 103 and the heater layer 134 is proximate the cover layer 116. The heat transfer layers 120 and 122 are positioned between the heater layers 132 and 134. Since the heater layer 134 is positioned between the cover layer 116 and the heat transfer layers 120 and 122, there are fluid openings 118 and 128 through the heater layer 134 near a first end, and fluid openings 119 and 126 through it near a second end as part of the fluid passages 104 and 106. The electrically resistive serpentine trace 138 is positioned on the heater layer 134 between the fluid openings.

One or more sensing elements are included in the temperature control device 100. The sensing elements are connected to the control system or other means of monitoring the sensor readings. The sensing elements may be used to indicate the temperatures at one or more locations in the temperature control device 100. For example, the sensors may monitor the interface surface 103 temperature, the heater layer 132 and 134 temperatures (separately or combined), the fluid temperatures or heat transfer layer temperature (separately or combined) and other places where sensing may be appropriate or desired.

In operation, temperature control device 100 may thermally condition the DUT 102 by providing a controlled thermal surface 103 to the DUT 102 during a testing phase. The DUT 102 is placed either directly in contact with the device or uses an interface material or area-adapting heat spreader, such as a metal plate, while in use. The DUT 102 is then subjected to the functional testing as required by the test specification. The control system 101, or test equipment, monitors the temperature of DUT 102 during the functional test and regulates the temperature of the heating and cooling elements associated with temperature control device 100. The integral heater layers 132 and 134 may be turned on and off, either together or separately, with varying power levels, to heat the device, and cooling fluid flows through the fluid passages 104 and 106 to cool the device. In one practical embodiment, the temperature of each heating element is independently controlled by adjusting the respective power applied to the element.

The temperature control device 100 is configured to heat or cool the DUT by providing a direct thermal path to the DUT. In accordance the embodiments shown, the thermal path to the DUT is from the controlled thermal interface surface 103 to the cover layer(s) 116. In FIG. 3, the thermal path includes the first heater layer 132, the second heater layer 134, the first heat transfer layer 122 and the second heat transfer layer 120. In FIG. 4, the thermal path includes the first heat transfer layer 122, the second heat transfer layer 120 the first heater layer 132 and the second heater layer 134. In FIG. 5, the thermal path includes the first heater layer 132, first heat transfer layer 122, the second heat transfer layer 120 and the second heater layer 134. There may additional configurations that provide additional thermal paths.

Of course, the size and shape of the controlled thermal interface surface 103 of the temperature control device 100 may be suitably configured to mate with the size and shape of the particular DUT. For example, to test a common microprocessor, the size of the device may be 1 inch wide by 2 inches long and 0.25 inches thick (other sizes and shapes can be employed to accommodate the particular application). Alternatively, a suitably configured mating element, formed from a thermal conductor, can be placed between temperature control device 100 and the DUT 102. A mating element may be desirable to accommodate the specific physical characteristics of the DUT or to concentrate heating or cooling in certain areas of the DUT.

As mentioned above, the heat transfer layers 120 and 122 may include a number of cooling fins that are configured and arranged to promote heat transfer from to the fluid or coolant. The plurality of parallel cooling fins are also parallel to the fluid flow path in the heat transfer layers 120 and 122. In accordance with a practical embodiment, each of the cooling fins is approximately 0.012 inches thick. Furthermore, neighboring cooling fins are separated by approximately 0.012 inches. Alternatively, the heat transfer layers may employ any suitable cooling fin design and the particular design may depend on any number of parameters such as the thermal properties of the heat sink material, the thermal and physical properties of the coolant, the flow rate of the coolant, the size of heat transfer layers, and the like.

Electrically conductive "ink" may be used to form the electrically resistive serpentine traces 138 on the substrate. In accordance with one practical embodiment, the conductive ink includes a nickel, tungsten, or other alloy having a relatively high electrical resistance. The substrate is patterned and the conductive ink is printed onto the surface of the substrate, which might then be joined to additional layers by stacking. Signal wires or leads 136 are soldered or otherwise attached to the respective traces to carry the respective heater control signals from the control system. The electrical heating elements traces are not exposed to the DUT.

Numerous methods of manufacture may be used to construct the temperature control device 100. In one embodiment, all of the layer substrates are manufactured in a "green" ceramic state, then once the fluid channels, electrically resistive metallic serpentine traces, sensors and connections have been formed on the substrates, the layers are joined by co-firing forming a monolithic type structure. In another embodiment, the layer substrates are silicon and once the fluid channels, electrically resistive metallic serpentine traces, sensors and connections have been formed on the substrates, the layers are joined by eutectic bonding, or other high-thermal-conductivity joining process.

FIGS. 6-11 show various views of another temperature control device 200 configured in accordance with the invention. Like the temperature control device described above, the device 200 generally includes an interface surface 202 configured to provide a thermal path to a DUT, a fluid-cooled heat sink structure 204 configured to maintain a cross-flow of coolant in three dimensions for cooling interface surface 202; and a heater assembly 206 configured to heat interface surface 202.

Figure 8:
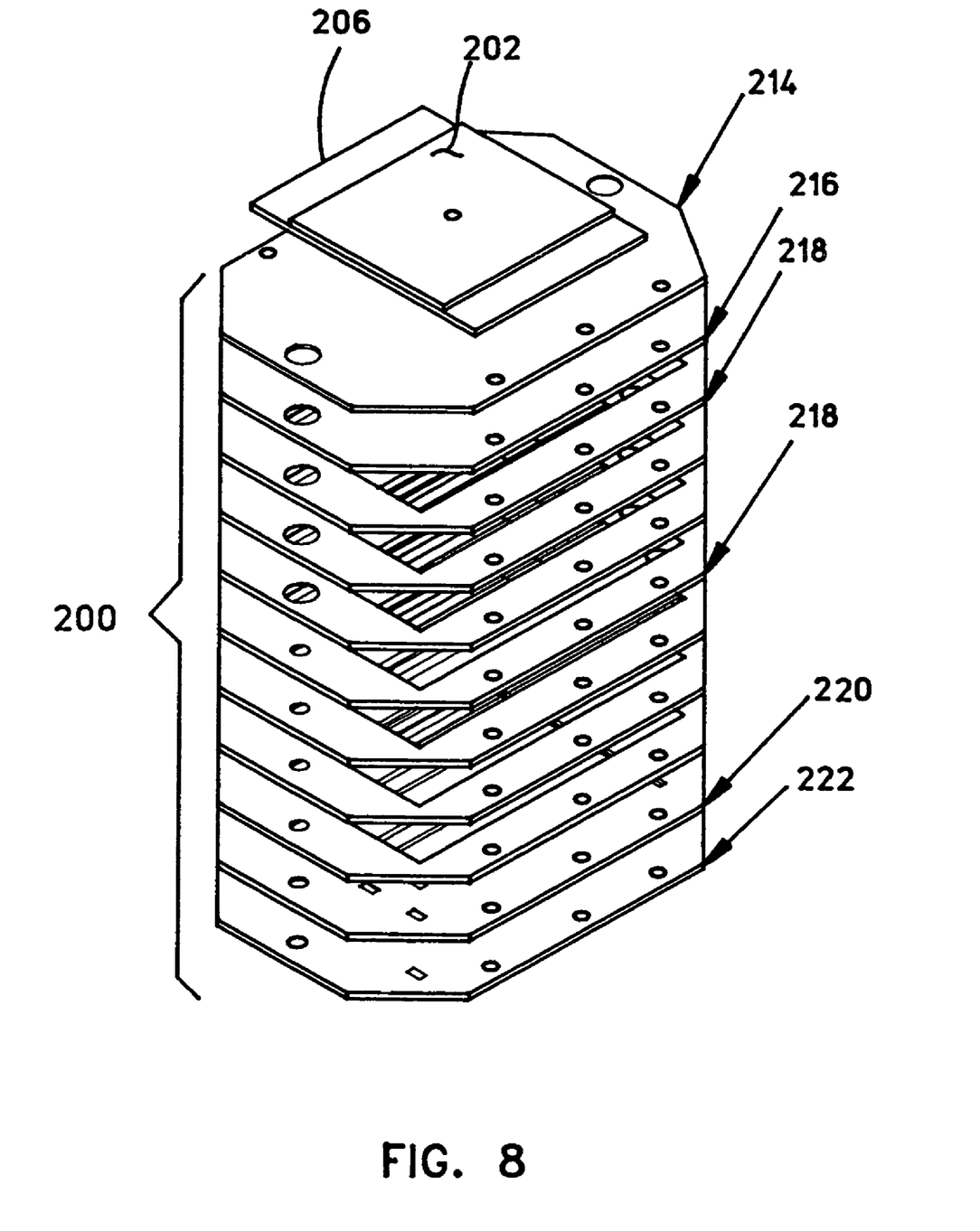
FIG. 8 is an exploded perspective view of the temperature control device shown in FIGS. 6 and 7.

Heater assembly 206 may be configured as described above in connection with device 100. Heater assembly 206 includes one or more electrical heater elements coupled to a substrate. As shown in FIG. 8, heater assembly 206 may include a number of terminals or contact points (hidden from view) that accommodate one or more heater control signals. In a typical implementation, the control signals are fed through holes in the heat sink en route to the terminals on heater assembly 206. In operation, interface surface 202 is held against a DUT (not shown), heater assembly 206 is controlled to regulate heat applied to the DUT, and coolant is passed through heat sink structure 204 to regulate the temperature of the DUT. The flow rate and/or temperature of the coolant can be controlled by a coolant flow control system (not shown) coupled to the device 200. In this regard, device 200 includes one or more fluid inlets 210 and one or more fluid outlets 212 formed therein to accommodate the flow of coolant. For clarity, fluid coupling elements for the inlets 210 and outlets 212 are not shown in connection with device 200.

Temperature control device 200 is preferably formed from a plurality of layers, as best shown in FIG. 8. The illustrated embodiment includes heater assembly 206, a first cover layer 214, a first intermediate layer 216, a plurality of microchannel layers 218, a second intermediate layer 220 having fluid inlets and fluid outlets formed therein, and a second cover layer 222 having fluid inlets and fluid outlets formed therein. The various layers are coupled together using one or more known techniques such as bonding, soldering, adhesive, or the like. After the stack is constructed, the fluid inlets and outlets formed in second intermediate layer 220 and second cover layer 222 form fluid inlets 210 and fluid outlets 212.

In a practical embodiment of temperature control device 200, first cover layer 214 is formed from copper, first intermediate layer 216 is formed from a ceramic substrate material, each of the microchannel layers 218 is formed from copper, second intermediate layer 220 is formed from a ceramic substrate material, and second cover layer 222 is formed from copper. First and second intermediate layers 216 and 220 function to "isolate" the effects of thermal expansion and contraction of the copper layers from heater assembly 206 (which, in the example embodiment, is ceramic based). The layers are coupled together in a manner that forms fluid seals such that the cooling fluid is maintained in the proper channels and flow paths within heat sink structure 204. In other words, heat sink structure 204 is formed such that (ideally) the cooling fluid can only enter through fluid inlets 210 and only exit through fluid outlets 212.

Figure 10:
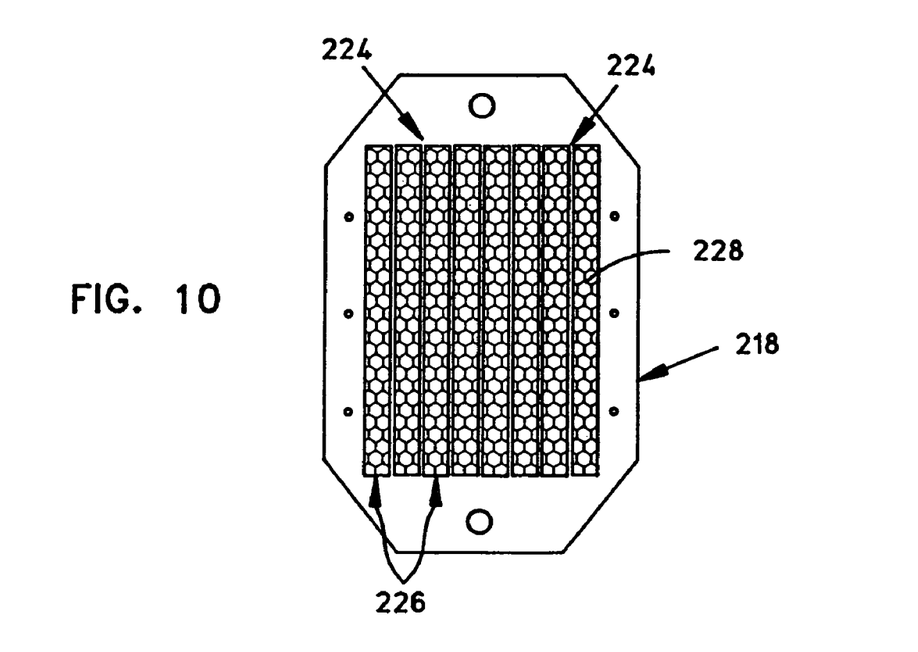
FIG. 10 is a top view of one of the internal layers of the temperature control device shown in FIG. 8.

Referring to FIG. 10, each of the microchannel layers 218 includes ribs 224 that separate adjacent fluid conduits 226 from one another. The microchannel layer 218 shown in FIG. 10 includes seven ribs 224 and eight conduits 226. After the various microchannel layers 218 are stacked together, ribs 224 form "walls" between adjacent conduits 226. In accordance with one practical embodiment, ribs 224 are each approximately 0.020 inches wide, each conduit 226 is approximately 1.850 inches long, and (after stacking) heat sink structure is approximately 0.158 inches thick. Of course, these dimensions can vary to accommodate different applications and different DUT sizes.

Figure 9:
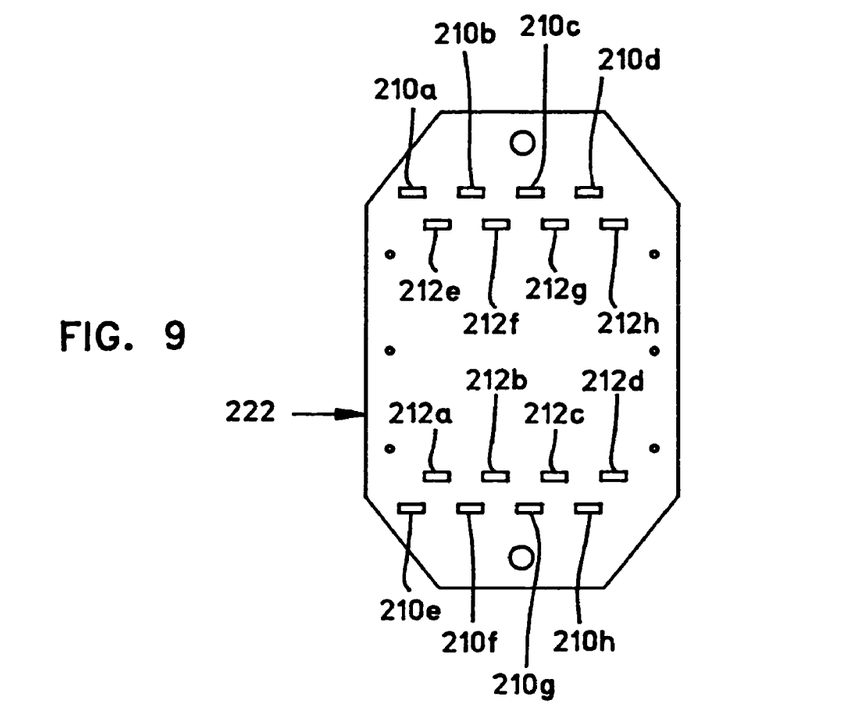
FIG. 9 is a top view of one of the outer layers of the temperature control device shown in FIG. 8.

Temperature control device 200 is suitably configured to establish a cross-flow of coolant within heat sink structure 204. In the example embodiment, fluid conduits 226 are coplanar and parallel. In addition, one subset of the fluid conduits 226 accommodate coolant flow in a first direction while another subset of the fluid conduits 226 accommodate coolant flow in a second direction. Preferably, the first direction is opposite to the second direction. Referring to FIG. 9, device 200 maintains the coolant cross-flow by directing the coolant into certain fluid inlets 210. In this regard, fluid inlets 210*a-d*, which respectively correspond to fluid outlets 212*a-d*, accommodate coolant flow in a first direction (from the top to the bottom of FIG. 9). In contrast, fluid inlets 210*e-h*, which respectively correspond to fluid outlets 212*e-h*, accommodate coolant flow in a second direction (from the bottom to the top of FIG. 9). This flow pattern results in a different flow direction in adjacent conduits 226. Ultimately, the coolant cross-flow reduces the thermal gradient over the interface surface 206 and results in more efficient temperature regulation of the DUT.

Figure 11:
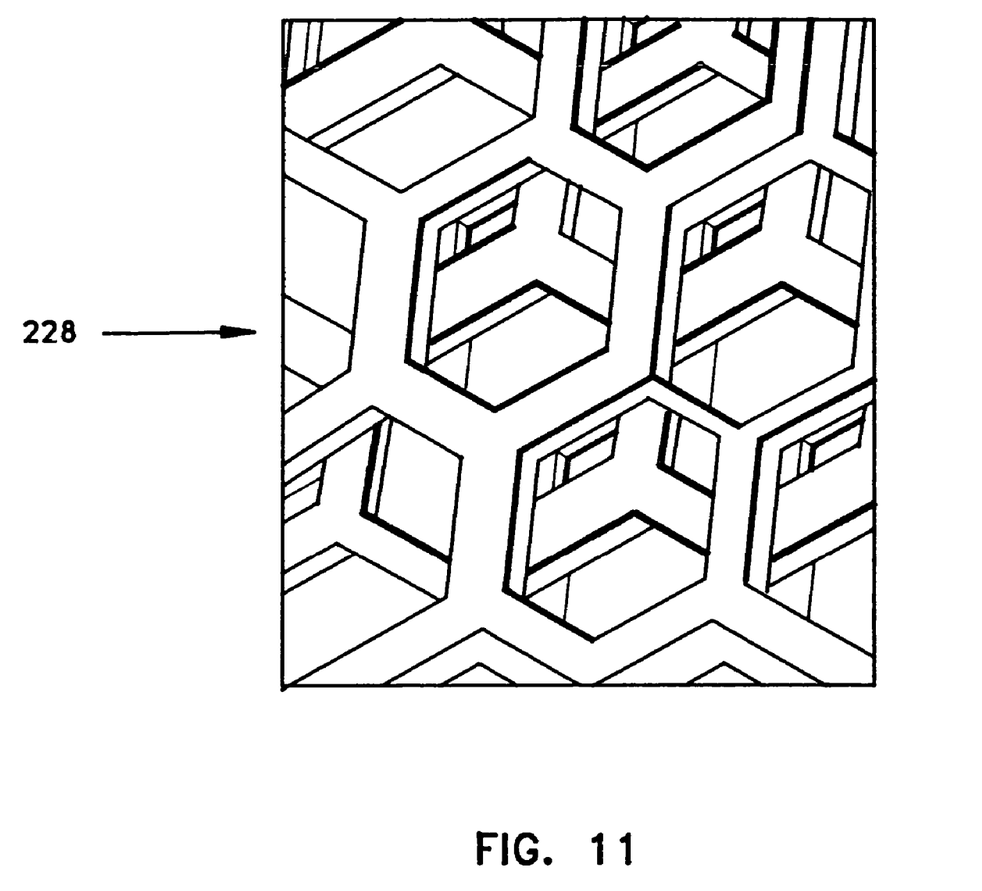
FIG. 11 is a schematic perspective view of an example microchannel structure that may be formed within the temperature control device shown in FIGS. 6 and 7.

Each microchannel layer 218 also includes a web, mesh, matrix, lattice, or similar structure 228 located within the fluid conduits 226. The web structure 228 may employ a geometric pattern, e.g., squares, triangles, circles, hexagons, octagons, or the like. As shown in FIG. 11, the example embodiment employs a lattice of hexagons for web structure 228. In the illustrated embodiment, the web structure 228 in each microchannel layer 218 is planar or flat such that only one "level" of hexagons reside in each microchannel layer 218. The web structure 228 in adjacent stacked microchannel layers 218 is staggered or offset such that, when heat sink structure 204 is formed, the web structures 228 create respective three-dimensional microchannel structures located within the various fluid conduits 226. FIG. 11 depicts three offset web structures 228 forming such a three-dimensional microchannel structure.

The resulting three-dimensional microchannel structures are configured to direct coolant flow in three dimensions within each fluid conduit. Due to the offset nature of the individual web structures 228, the coolant will flow laterally through the three-dimensional microchannel structure while flowing vertically over and under the individual web structure levels. The individual web structures 228 may be arranged and coupled together such that continuous heat transfer paths are formed from the top to the bottom of heat sink structure 204, thus improving the heat transfer efficiency.

In the example embodiment shown herein, fluid conduits 226 and respective microchannel structures are adjacent to one another. In an alternate embodiment (not shown), a first subset of fluid conduits are located at one layer, a second subset of fluid conduits are located at a second layer below the first layer, and both groups of fluid conduits are located above interface surface 206. Coolant cross-flow may be established in the manner described above and/or by directing coolant in one direction through the first subset of fluid conduits and in a second direction through the second subset of fluid conduits.

The layered design of these devices allows the flexibility to tailor the heat sink efficiency and the pressure drop across the heat sink by simply changing the number of layers. In this regard, more layers results in higher heat sink efficiency to remove heat, which in turn results in a better response time for an active thermal control system. Additional layers also results in lower pressure drop as the cooling fluid flows across the heat sink. Lower pressure drop results in a lower cooling fluid inlet pressure requirement, which is desirable for practical applications. Additional layers also results in higher thermal mass for the heat sink. Consequently, the layered heat sink design facilitates rapid cost effective provisioning of an optimized device for the given application by allowing the designer to strike a balance between thermal efficiency and thermal mass.

The present invention has been described above with reference to preferred embodiments. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. A temperature control device, comprising:
   an interface surface configured to provide a thermal path to a device under test ("DUT");
   a fluid-cooled heat sink having at least a first layer residing in a first plane and a second layer residing in a second plane, in which a coolant flows through a first cooling passage and across the first layer residing in the first plane and in which coolant flows through a second cooling passage and across the second layer residing in the second plane, said first plane being closer to said interface surface than said second plane; and
   one or more integral heater assemblies.

2. A temperature control device according to claim 1, further comprising one or more thermal sensing elements.

3. A temperature control device according to claim 1, wherein said first layer includes one or more flow channels and said second layer includes one or more flow channels.

4. A temperature control device according to claim 1, wherein said first layer has a flow path in a first direction and said second layer has a flow path in a second direction.

5. A temperature control device according to claim 4, wherein said flow path in said first direction is opposite to said flow path in said second direction.

6. A temperature control device according to claim 1, wherein said one or more integral heater assemblies are planar and parallel to said interface surface.

7. A temperature control device according to claim 1, wherein said one or more integral heater assemblies includes a substrate and at least one heating element formed on said substrate.

8. A temperature control device according to claim 7, wherein said at least one heating element comprises one or more electrically resistive serpentine traces.

9. A temperature control device according to claim 1, wherein each of said one or more integral heater assemblies has an independently adjustable power level.

10. A temperature control device according to claim 1, wherein said one or more integral heater assemblies are positioned between said interface surface and said fluid-cooled heat sink.

11. A temperature control device according to claim 1, wherein said fluid-cooled heat sink further includes a cover layer with a first sub-layer having a first inlet and a first outlet for a first cooling passage and a second inlet and a second outlet for a second cooling passage.

12. A temperature control device according to claim 11, wherein said cover layer includes a second sub-layer having first and second openings positioned to provide a continuous passage for the second cooling passage with the second inlet and the second outlet, respectively, and having first and second fluid openings positioned to provide a continuous passage for the first cooling passage with the first inlet and the first outlet, respectively.

13. A temperature control device according to claim 12, wherein said cover layer includes a third sub-layer having third and fourth fluid openings positioned to provide a continuous passage for the first cooling passage with the first and second fluid openings, respectively, and having fifth and sixth fluid openings positioned to provide a continuous passage for the second cooling passage with the first and second openings, respectively.

14. A temperature control device according to claim 13, wherein said first layer includes seventh and eight fluid openings positioned to provide a continuous passage for the first cooling passage with the third and fourth fluid openings, respectively.

15. A temperature control device according to claim 14, wherein a flow path of the first cooling passage provides coolant in a first direction through the second layer, and a flow path of the second cooling passage provides coolant in a second direction, different from the first direction, through the first layer.

* * * * *